United States Patent
Gajendra et al.

(10) Patent No.: US 11,221,182 B2
(45) Date of Patent: Jan. 11, 2022

(54) APPARATUS WITH MULTISTAGED COOLING

(71) Applicant: Applied Materials, Inc., Santa Clara, CA (US)

(72) Inventors: Manoj A. Gajendra, Bangalore (IN); Arul Vasanth Subramanian, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 16/508,598

(22) Filed: Jul. 11, 2019

(65) Prior Publication Data
US 2020/0041211 A1    Feb. 6, 2020

Related U.S. Application Data

(60) Provisional application No. 62/712,585, filed on Jul. 31, 2018.

(51) Int. Cl.
   *F28D 1/053*    (2006.01)
   *H01L 21/67*    (2006.01)
   *H01J 37/32*    (2006.01)

(52) U.S. Cl.
   CPC .... *F28D 1/05391* (2013.01); *H01J 37/32357* (2013.01); *H01J 37/32844* (2013.01); *H01L 21/67248* (2013.01); *H01J 2237/002* (2013.01)

(58) Field of Classification Search
   CPC ........ F28D 1/05391; F28D 7/10; F28D 7/106; H01L 21/67248; H01J 37/32357; H01J 37/32844; H01J 2237/002

(Continued)

(56) References Cited

U.S. PATENT DOCUMENTS 1,787,904 A * 1/1931 Heyward ........... B60H 1/00335
                                                165/154
3,358,749 A * 12/1967 Chisholm ............. B01F 5/0646
                                                165/141

(Continued)

FOREIGN PATENT DOCUMENTS

GN    1613000 A    5/2005
GN    101432847 A    5/2009

(Continued)

OTHER PUBLICATIONS

Machine translation of JP 04-332389; Retrieved Dec. 30, 2020 (Year: 2020).*

(Continued)

*Primary Examiner* — Eric S Ruppert
*Assistant Examiner* — Hans R Weiland
(74) *Attorney, Agent, or Firm* — Patterson + Sheridan, LLP

(57) ABSTRACT

Embodiments described herein relate to a heat exchanger for abating compounds produced in semiconductor processes. When hot effluent flows into the heat exchanger, a coolant can be flowed to walls of a heat exchanging surface within the heat exchanger. The heat exchanging surface can be a curved shaped which creates a multi stage cross flow path for the hot effluent to flow down the heat exchanger. This flow path forces the hot effluent to hit the cold walls of the heat exchanging surface, significantly cooling the effluent and preventing it from flowing directly into the vacuum pumps and causing heat damage. Embodiments described herein also relate to methods of forming a heat exchanger. The heat exchanger can be created by sequentially depositing layers of thermally conductive material on surfaces using 3-D printing, creating a much smaller foot print and reducing costs.

20 Claims, 9 Drawing Sheets

(58) Field of Classification Search
USPC .......................................................... 165/119
See application file for complete search history.

(56) References Cited

U.S. PATENT DOCUMENTS

| | | | | |
|---|---|---|---|---|
| 4,052,308 | A * | 10/1977 | Higgs | B01D 35/02 |
| | | | | 210/167.32 |
| 4,194,560 | A * | 3/1980 | Matsuzaki | F28D 7/106 |
| | | | | 165/141 |
| 4,597,871 | A * | 7/1986 | Okouchi | B01D 29/114 |
| | | | | 210/456 |
| 5,322,567 | A | 6/1994 | Deaton et al. | |
| 5,397,179 | A * | 3/1995 | Berlin | F28D 7/106 |
| | | | | 138/38 |
| 5,628,898 | A | 5/1997 | Eimer et al. | |
| 6,395,175 | B1 * | 5/2002 | Gao | B01F 3/0446 |
| | | | | 210/199 |
| 7,988,755 | B2 * | 8/2011 | Cho | C23C 16/4412 |
| | | | | 55/385.2 |
| 8,459,342 | B2 * | 6/2013 | O'Donnell | F24H 9/0026 |
| | | | | 165/109.1 |
| 9,230,780 | B2 | 1/2016 | Cox et al. | |
| 9,240,308 | B2 | 1/2016 | Cox et al. | |
| 9,543,124 | B2 | 1/2017 | Cox et al. | |
| 9,552,967 | B2 | 1/2017 | Cox et al. | |
| 2003/0022617 | A1 * | 1/2003 | Gebke | F24F 13/068 |
| | | | | 454/306 |
| 2007/0187067 | A1 * | 8/2007 | Horiguchi | F28D 7/106 |
| | | | | 165/70 |
| 2008/0251241 | A1 * | 10/2008 | Yusa | F28D 7/106 |
| | | | | 165/154 |
| 2011/0174469 | A1 * | 7/2011 | Kim | F28D 7/106 |
| | | | | 165/154 |
| 2015/0251133 | A1 | 9/2015 | Cox et al. | |
| 2015/0252473 | A1 | 9/2015 | Dickinson | |
| 2016/0042916 | A1 | 2/2016 | Wang | |
| 2016/0089630 | A1 | 3/2016 | Dickinson et al. | |
| 2016/0107117 | A1 | 4/2016 | Raj et al. | |
| 2016/0166868 | A1 | 6/2016 | Dickinson | |
| 2016/0276179 | A1 | 9/2016 | Fisher et al. | |
| 2016/0376710 | A1 | 12/2016 | Ho et al. | |
| 2017/0027049 | A1 | 1/2017 | Wang et al. | |
| 2017/0133208 | A1 | 5/2017 | Cox et al. | |
| 2017/0138670 | A1 * | 5/2017 | Penny | F28D 7/106 |
| 2017/0205145 | A1 * | 7/2017 | Manteiga | F28D 7/1638 |
| 2017/0216767 | A1 | 8/2017 | Cox et al. | |
| 2017/0254603 | A1 * | 9/2017 | Bronnert | F28F 27/00 |
| 2017/0297066 | A1 | 10/2017 | Dickinson | |
| 2017/0301524 | A1 | 10/2017 | Cox et al. | |
| 2017/0356692 | A1 * | 12/2017 | Schaufler | F28D 7/106 |
| 2018/0166306 | A1 | 6/2018 | Hou et al. | |
| 2018/0221816 | A1 | 8/2018 | Van Gompel et al. | |
| 2018/0226234 | A1 | 8/2018 | Dickinson | |
| 2018/0337027 | A1 | 11/2018 | L'Heureux et al. | |
| 2019/0293364 | A1 * | 9/2019 | Stockton | F28F 1/025 |

FOREIGN PATENT DOCUMENTS

| | | |
|---|---|---|
| GN | 102128554 A | 7/2011 |
| GN | 104697364 A | 6/2015 |
| GN | 210952437 U | 7/2020 |
| JP | 50-44758 B2 | 5/1975 |
| JP | 04-332389 | 11/1992 |
| JP | 04332389 A * | 11/1992 |
| JP | H04332389 A | 11/1992 |
| JP | H07508218 A | 9/1995 |
| JP | 2016032827 A | 3/2016 |
| JP | 2017203420 A | 11/2017 |
| KR | 100335406 B1 | 9/2002 |
| KR | 20060013926 A | 2/2006 |
| KR | 100676927 B1 | 2/2007 |
| TW | I230629 B | 4/2005 |

OTHER PUBLICATIONS

JP Office Action dated Oct. 5, 2020 for Application No. 2019-140475.
TW Search Report dated Mar. 4, 2020 for Application No. 108127139.
KR Office Action dated Sep. 16, 2020 for Application No. 10-2019-0091801.
CN Search Report dated Oct. 10, 2020 for Application No. 201910701040.1.
CN Office Action dated Apr. 21, 2021 for Application No. 201910701040.1.

* cited by examiner

APPARATUS WITH MULTISTAGED COOLING

CROSS-REFERENCE TO RELATED APPLICATIONS

This application claims priority to U.S. Provisional Patent Application No. 62/712,585, filed Jul. 31, 2018, which is herein incorporated by reference in its entirety.

BACKGROUND

Field

Embodiments described herein generally relate to semiconductor processing equipment and, more particularly, to an abatement system and a heat exchanger for abating compounds produced in semiconductor processes.

Description of the Related Art

The process gases used by semiconductor processing facilities include many compounds, such as perfluorocarbons (PFCs), which must be abated or treated before disposal, due to regulatory requirements and environmental and safety concerns. Typically, a remote plasma source may be coupled to a processing chamber to abate the compounds coming out of the processing chamber. A reagent may be injected into the plasma source to assist the abatement of the compounds.

Conventional abatement technology for abating PFCs utilizes water vapor as a reagent, which provides good destruction removal efficiency (DRE). However, abatement of certain compounds using water vapor in the remote plasma source can result in the formation of solid particles in the remote plasma source due to lower combination reaction time available and equipment downstream of the remote plasma source, such as exhaust lines and pumps. In addition, the exhaust exiting the remote plasma source may be at an elevated temperature, which can cause issues at the pump downstream of the remote plasma source. Existing solutions in the art that attempt to recombine and cool the effluent have been very bulky and inefficient, including having other maintenance issues.

Accordingly, there is a need for an improved abatement system with an effective heat exchanger for abating compounds produced in semiconductor processes.

SUMMARY

One or more embodiments described herein generally provide a heat exchanger for abating compounds produced in semiconductor processes.

In one embodiment, a heat exchanger configured to exchange heat with a flowing fluid includes a first mounting flange having a central opening that extends through a connection surface of the first mounting flange, wherein the connection surface is parallel to a first plane; a second mounting flange having a central opening that extends through a connection surface of the second mounting flange, wherein the second mounting flange is disposed a distance in a first direction from the first mounting flange; an outer wall that is configured to enclose an internal region of the heat exchanger, wherein the outer wall and internal region are disposed between the first mounting flange and the second mounting flange; an inner wall that is disposed within the internal region, wherein the inner wall is positioned to isolate a heat exchanging region of the internal region from an outer region of the internal region, the outer region defined by a space formed between the inner wall and the outer wall; a heat exchanging fluid inlet port and a heat exchanging fluid outlet port, wherein the heat exchanging fluid inlet port and the heat exchanging outlet port are each in fluid communication with the outer region; and a cone tray that is disposed within the inner wall, wherein the cone tray is configured to collect particles passing through the central opening of the first mounting flange.

In another embodiment, a heat exchanger configured to exchange heat with a flowing fluid includes a first mounting flange having a central opening that extends through a connection surface of the first mounting flange, wherein the connection surface is parallel to a first plane; a second mounting flange having a central opening that extends through a connection surface of the second mounting flange, wherein the second mounting flange is disposed a distance in a first direction from the first mounting flange; an outer wall that is configured to enclose an internal region of the heat exchanger, wherein the outer wall and internal region are disposed between the first mounting flange and the second mounting flange; an inner wall that is disposed within the internal region, wherein the inner wall is positioned to isolate a heat exchanging region of the internal region from an outer region of the internal region; a cone tray that is enclosed within the inner wall, wherein the cone tray is configured to collect particles passing through the central opening; wherein: the outer region is defined by a space formed between the inner wall and the outer wall; and the inner wall has a heat exchanging surface that is adjacent to the heat exchanging region; and a heat exchanging fluid inlet port and a heat exchanging fluid outlet port, wherein the heat exchanging fluid inlet port and the heat exchanging outlet port are each in fluid communication with the outer region.

One or more embodiments described herein also generally relate to methods of forming a heat exchanger.

In one embodiment, a method of forming a heat exchanger includes forming a first mounting flange having a central opening, wherein forming the first mounting flange comprises sequentially depositing layers of a thermally conductive material on a first surface; forming a heat exchanging body on the first mounting flange, wherein the heat exchanging body has a heat exchanging section that encloses a heat exchanging region that extends in a direction that is perpendicular to the first surface, and forming the heat exchanging body comprises sequentially depositing layers of the thermally conductive material on a surface of the formed first mounting flange, wherein the sequentially deposited layers disposed within the heat exchanging section each include at least a portion of an outer wall and at least a portion of an inner wall, the outer wall is configured to enclose an internal region of the heat exchanging body, and the internal region has a central axis that is substantially perpendicular to the first surface, the inner wall is disposed within the internal region, and is positioned to isolate the heat exchanging region from an outer region of the internal region, wherein the outer region is defined by a space formed between the inner wall and the outer wall, the inner wall having a heat exchanging surface that is adjacent to the heat exchanging region, and the heat exchanging surface having a curvature that varies in a direction parallel to the central axis, and a tangent of the curvature at any point on the heat exchanging surface has an angle relative to central axis that is less than or equal to 45 degrees; and forming a second mounting flange on the heat exchanging body, the second mounting flange comprises sequentially depositing layers of a thermally conductive material on the heat exchanging body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to embodiments of an abatement system and a heat exchanger for removing unwanted compounds produced in semiconductor processes from the effluent stream. After leaving a plasma zone and entering the heat exchanger, a fluid and a solid effluent recombine and release a significant amount of energy, leading to a temperature increase of the already hot effluent. To counteract the temperature increase, a cooling mechanism is designed in the heat exchanger. The cooling mechanism can include a plurality of fin structures that have a heat exchanging surface. A coolant can be flowed within a portion of the heat exchanger to cool the walls of the heat exchanging surface. The heat exchanging surface has a curved shaped which creates a multi stage cross flow path for the hot effluent to flow down the heat exchanger. This flow path increases the residual time for the hot effluent to come in contact with the cold walls of the heat exchanging surface, increasing the cooling efficiency of the heat exchanger. Additionally, the flow path ensures the majority of the effluent comes into contact with the walls of the heat exchanging surface, significantly cooling the effluent and preventing it from flowing directly into the vacuum pumps and causing heat damage.

Embodiments described herein also generally relate to methods of forming a heat exchanger. The heat exchanger can be created by sequentially depositing layers of a thermally conductive material on a surface to form one or more walls of the heat exchanger. The sequential deposition includes a first mounting flange formed on a first surface and a heat exchanging body formed on a surface of the formed first mounting flange. A second mounting flange may be formed on a surface of the heat exchanging body. The layers can be deposited by using an additive manufacturing process, such as 3D printing and the like. This provides the advantage of allowing the recombination and staged cooling in much higher efficiency in a much smaller foot print, reducing costs.

Figure 1:
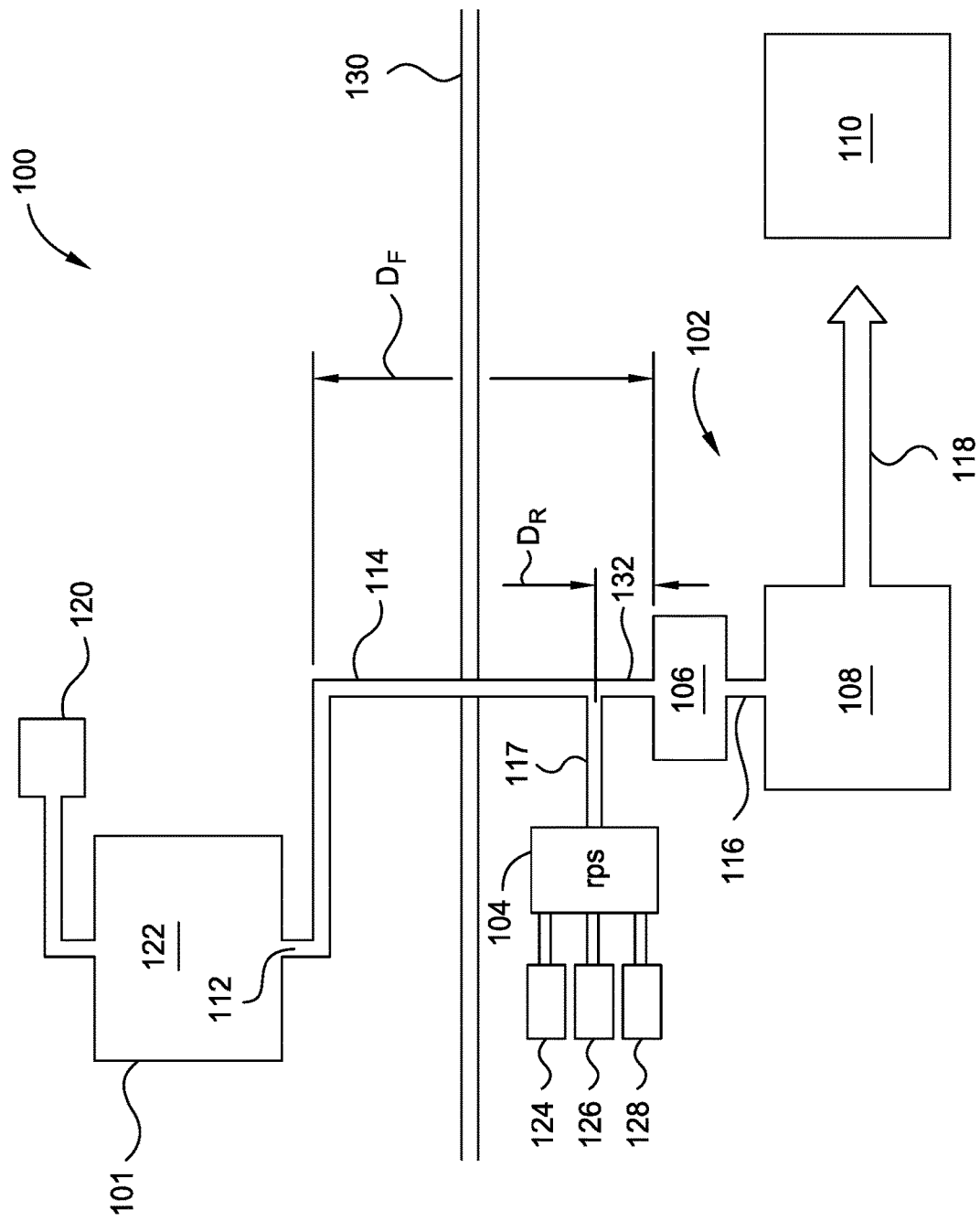
FIG. 1 is a schematic illustration of a processing system and abatement system including a remote plasma source and a heat exchanger according to at least one embodiment described herein.

FIG. 1 shows a schematic illustration of a processing system 100 and abatement system 102 including a plasma source 104 and a heat exchanger 106, according to at least one embodiment described herein. The processing system 100 includes at least a processing chamber 101 and the abatement system 102. The abatement system 102 includes at least the plasma source 104, the heat exchanger 106, and a process vacuum pump 108. The processing chamber 101 is generally configured to perform at least one integrated circuit manufacturing process, such as a deposition process, an etch process, a plasma treatment process, a preclean process, an ion implant process, or another similar integrated circuit manufacturing process. In some embodiments, the processing chamber 101 is configured to process a substrate for display or solar applications. The process performed in the processing chamber 101 may be plasma assisted. For example, the process performed in the processing chamber 101 may be a plasma deposition process for depositing a silicon-based material or a plasma etch process for removing a silicon-based material.

The processing chamber 101 has a chamber exhaust port 112 coupled to the heat exchanger 106 of the abatement system 102 via an exhaust foreline 114. The heat exchanger 106 is coupled to the processing chamber 101 in order to cool the exhaust exiting the plasma source 104 and to collect particles, such as silicon dioxide particles, formed in the exhaust foreline 114 exiting from the processing chamber 101. The heat exchanger 106 is coupled to an exhaust conduit 116 and to the process vacuum pump 108. An exhaust conduit 118 couples the process vacuum pump 108 to a facility exhaust 110. The process vacuum pump 108 is generally utilized to evacuate the processing chamber 101, while the facility exhaust 110 generally includes scrubbers or other exhaust cleaning apparatus for preparing the effluent of the processing chamber 101 to enter the atmosphere.

The heat exchanger 106 is coupled between the processing chamber 101 and the process vacuum pump 108 for reducing the temperature of the exhaust in the exhaust foreline 114 and for collecting particles in the exhaust foreline 114. In one example, the heat exchanger 106 is part of the abatement system 102. The exhaust exiting processing chamber 101 may deposit on cold surfaces (surfaces having a temperature substantially lower than the temperature of the exhaust) inside of the heat exchanger 106. An example of the material that may be collected in the heat exchanger 106 is silicon dioxide, which may be formed in a granular or particulate form.

In some embodiments, the processing chamber 101 includes a remote plasma source 120 for generating cleaning radicals, such as fluorine radicals, that are flowed into the processing region 122 of the processing chamber 101 to clean the processing chamber 101. Unreacted cleaning radicals may exit the processing chamber 101 and enter the exhaust foreline 114 and the heat exchanger 106, removing materials previously deposited in exhaust foreline 114 and the heat exchanger 106 during the integrated circuit manufacturing process. In some embodiments, the cleaning process performed within the processing chamber 101 is performed efficiently, which causes a minimum amount of unreacted cleaning radicals to exit the processing chamber 101 and enter the exhaust foreline 114. A cleaning process that efficiently cleans the processing chamber 101 will generally not provide enough cleaning radicals to effectively clean the heat exchanger 106 during normal use.

Therefore, to assure that enough unreacted cleaning radicals reach and efficiently clean the heat exchanger 106, the abatement system 102 includes the plasma source 104 that may be used to provide a cleaning plasma to clean the heat exchanger 106. The plasma source 104 is utilized to perform an abatement process on gases and/or other materials exiting the processing chamber 101 so that such gases and/or other materials may be subsequently trapped or converted into a more environmentally and/or process equipment friendly composition. The plasma source 104 may be, for example, an inductively coupled plasma source, a capacitively coupled plasma source, a direct current plasma source, or a microwave plasma source. The plasma source 104 may be coupled to the abatement system 102, to ionize cleaning, purge, carrier, or other process gases, to provide the ionized gases to the abatement system 102, and to generate cleaning radicals to clean the surfaces and trapped material found in the heat exchanger 106. For example, a first gas supply source 124 may be coupled to the plasma source 104 to provide an inert or non-reactive gas, such as argon (Ar) therethrough to the abatement system 102. A second gas supply source 126 may be coupled to the plasma source 104 to provide a cleaning gas, such as $NF_3$, therethrough to the abatement system 102. Other contemplated cleaning gases include $NF_2H$, $CHF_3$, $CF_4$, and the like. Additionally, a third gas supply source 128 may be coupled to the plasma source 104 to provide a reactive agent, such as $O_2$, therethrough to the abatement system 102.

The plasma source 104 may be coupled to the exhaust foreline 114 via a conduit 117, as shown in FIG. 1. The reactive gases facilitate the removal of accumulated deposits from the interior of the abatement system 102, thus reducing or eliminating the need for the disassembly of the abatement system 102 for cleaning. In one embodiment, cleaning radicals, such as an $NF_3$ plasma, generated in the plasma source 104, may flow into the exhaust foreline 114 and into the heat exchanger 106 to remove the solid byproduct materials or particles formed or collected in the heat exchanger 106.

In one embodiment, an oxidizing reagent, such as an $O_2$ plasma, generated in the plasma source 104, may be delivered into the exhaust foreline 114 from the plasma source 104 to react with precursor product flowing from the processing chamber 101 to the process vacuum pump 108 during deposition processing. The oxidizing reagent reacts with the precursor byproducts from the deposition process and facilitates the conversion of precursor gas byproduct into solid byproducts or particles to enhance the amount of solid byproduct or particles trapped in the heat exchanger 106. Increasing the amount of solid byproduct trapped in the heat exchanger 106 reduces the amount of reactant byproduct gases that flow through the heat exchanger 106 and into the process vacuum pump 108, exhaust conduit 118, and to the facility exhaust 110, thereby increasing the life expectancy of the process vacuum pump 108 and the exhaust conduit 118, and also reducing the time between maintenance for the process vacuum pump 108 and the exhaust conduit 118 contributing to increased tool uptime.

The heat exchanger 106 may be located a distance $D_F$, such as at least 10-40 feet or more, from the processing chamber 101 in a subfab location of the fabrication facility and may be separated by a wall 130. An outlet of the remote plasma source 104 of the abatement system 102 may flow into the exhaust foreline 114 at a location 132 in the exhaust foreline 114 that is substantially adjacent to an entrance of the heat exchanger 106. In one example, the location 132 is positioned a distance DR before the exhaust foreline 114 enters the heat exchanger 106, such as a distance of between 6 and 18 inches, or about 12 inches. It has been found the heat exchanger 106 captures more solid byproduct material when an $O_2$ plasma, generated by the plasma source 104, is introduced into the exhaust foreline 114 at a distance DR, such as between 6 and 18 inches, from the entrance to the heat exchanger 106.

The exhaust conduit 118 allows gases to flow from the process vacuum pump 108 to the facility exhaust 110. The exhaust foreline 114, exhaust conduit 116, process vacuum pump 108, exhaust conduit 118, and associated hardware may be formed from one or more process-compatible materials, such as aluminum, anodized aluminum, nickel plated aluminum, stainless steel, and combinations and alloys thereof, for example. The heat exchanger 106 may be formed of similar process-compatible materials, or made of materials conducive to condensation of the exhaust gases, for example. The facility exhaust 110 may be a burn/wet abatement subsystem, as is known in the semiconductor fabrication industry, for example.

The abatement system 102 may be provided in a separate location from the processing chamber 101 within the fabrication facility and separated from the processing chamber 101 by the wall 130. The separation of the abatement system 102 from the processing chamber 101 allows for maintenance of the abatement system in an environment that does not require as stringent clean room air purity class requirements.

Figure 2A:
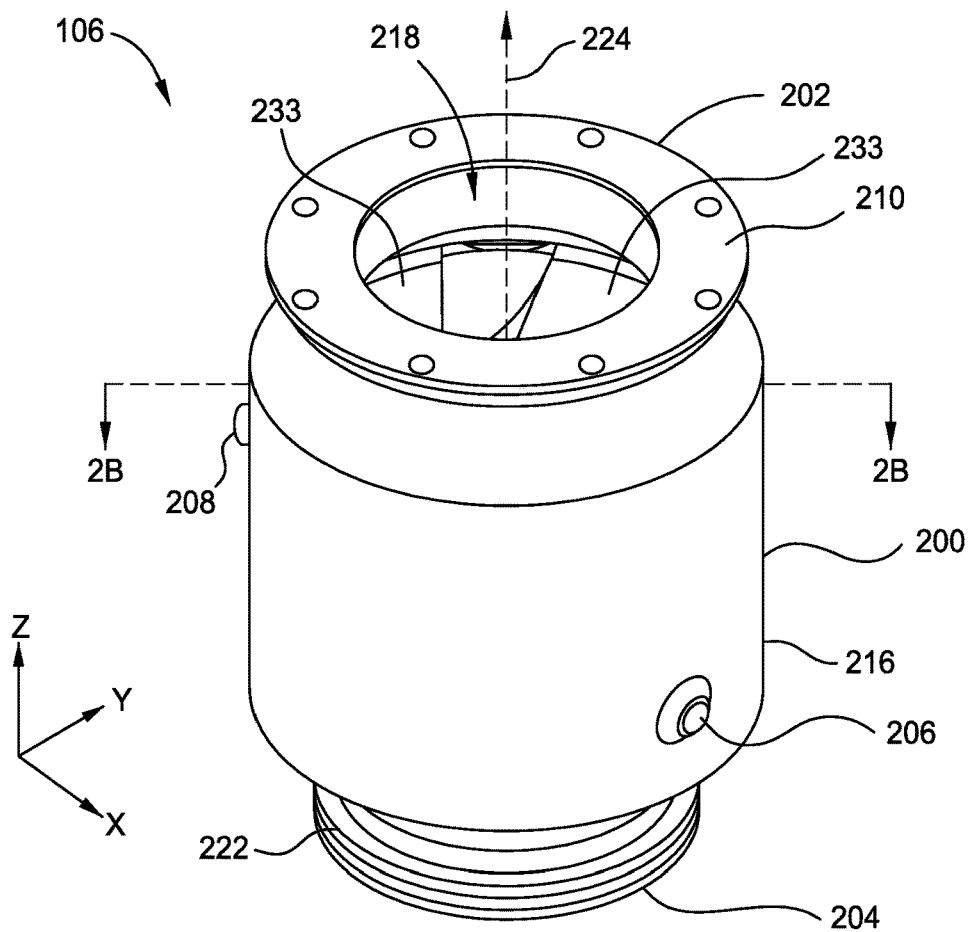
FIG. 2A is a schematic perspective view of at least one embodiment of the heat exchanger of FIG. 1.
Figure 2B:
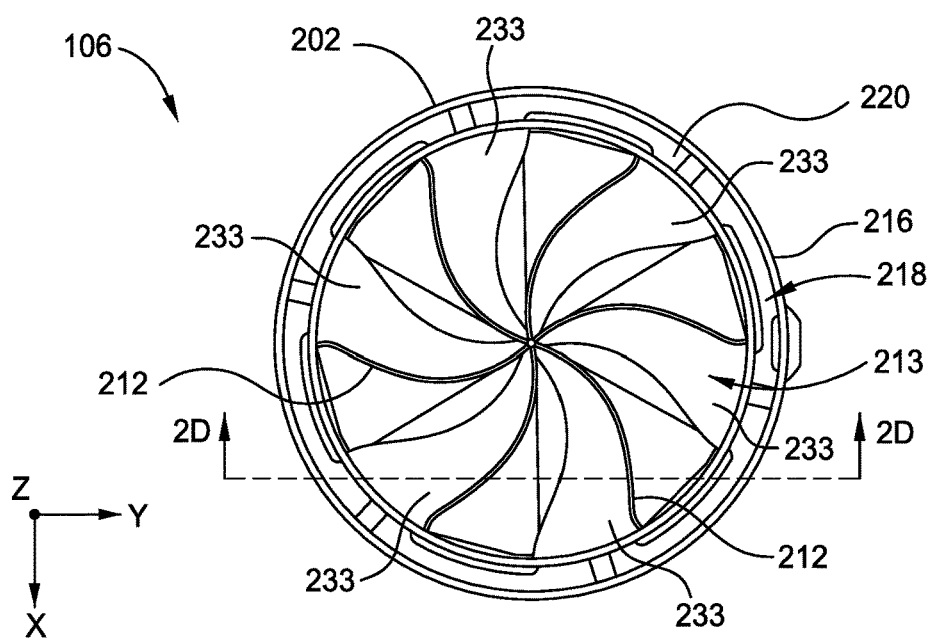
FIG. 2B is a top section view of at least one embodiment of the heat exchanger of FIG. 1 that is sectioned along a horizontal plane (X-Y plane) coincident with line 2B-2B shown in FIG. 2A.
Figure 2C:
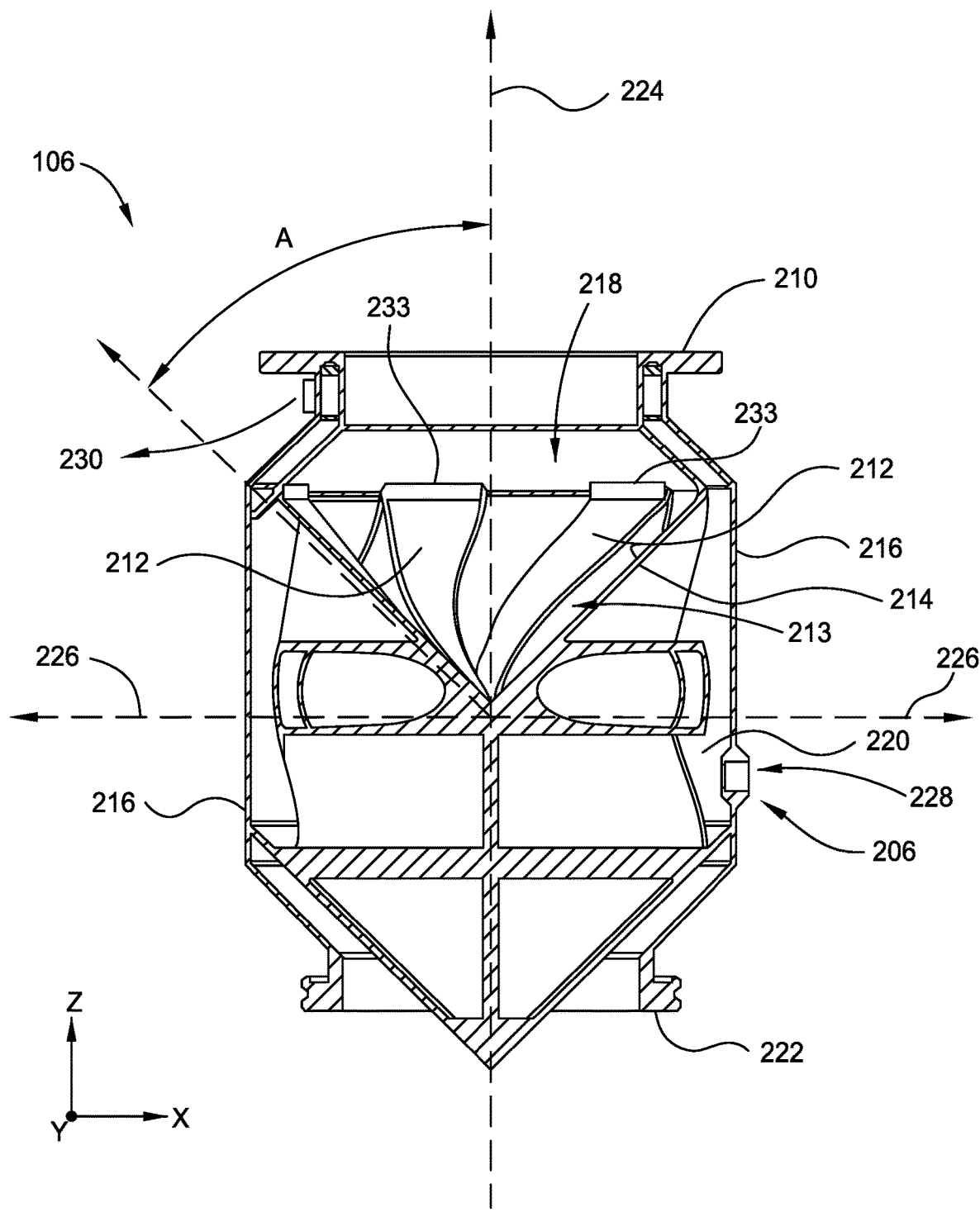
FIG. 2C is a schematic cross-sectional view of at least one embodiment of the heat exchanger of FIG. 1.
Figure 2D:
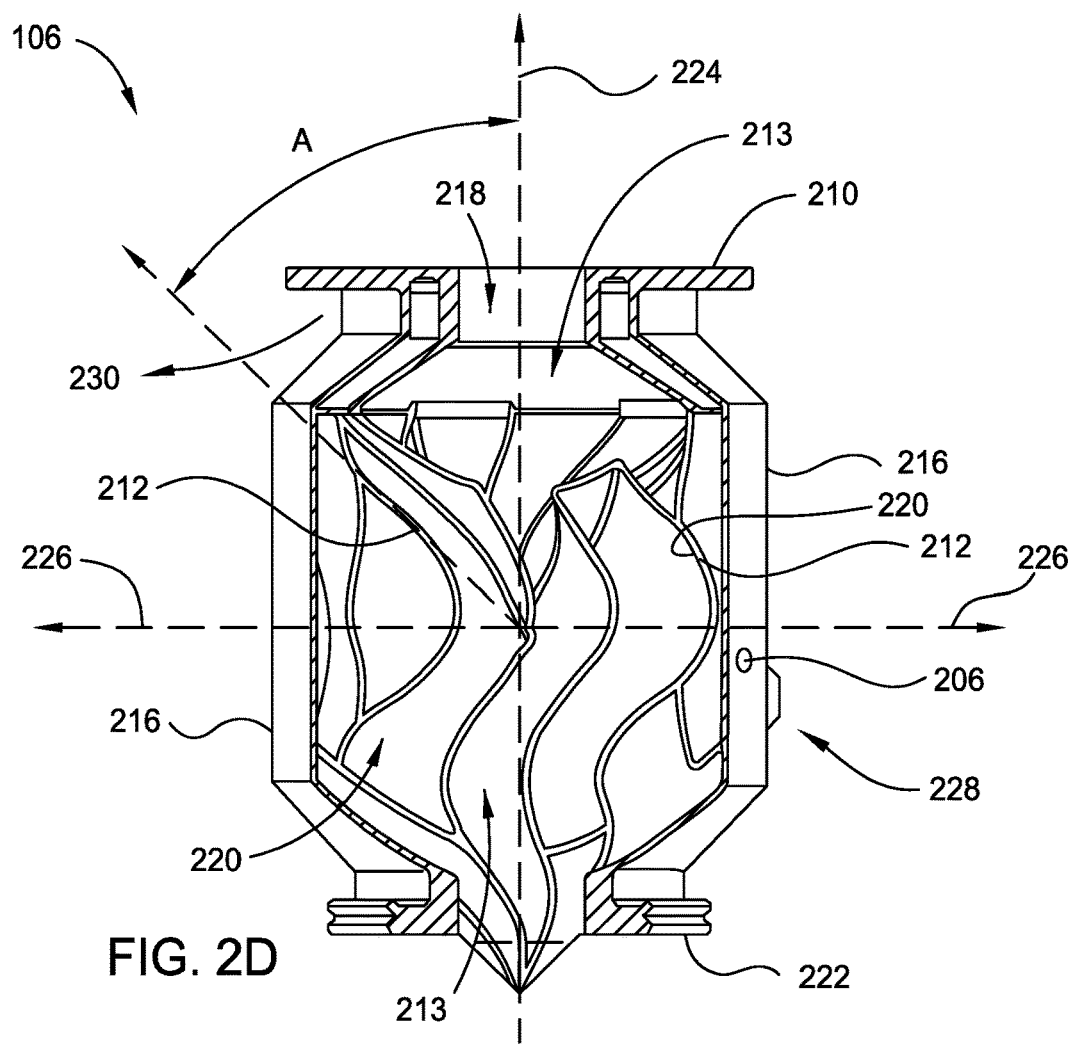
FIG. 2D is another schematic cross-sectional view of at least one embodiment of the heat exchanger of FIG. 1 that is sectioned along a vertical plane (Y-Z plane) coincident with line 2D-2D shown in FIG. 2B.

FIGS. 2A-2D show schematic, top, and cross-sectional views of at least one embodiment of the heat exchanger 106 of FIG. 1. As shown in FIG. 2A, the heat exchanger 106 includes a heat exchanging body 200, a first end 202, a second end 204 opposite the first end 202, an inlet port 206, and an outlet port 208 opposite the inlet port 206. FIG. 2B is a top section view of the heat exchanger 106, which was sectioned along a horizontal plane (X-Y plane) coincident with line 2B-2B shown in FIG. 2A. FIG. 2C is a schematic cross-sectional view of the heat exchanger 106 of FIG. 1. FIG. 2D is schematic cross-sectional view of the heat exchanger 106 of FIG. 1, which was sectioned by a vertical plane (Y-Z plane) coincident with line 2D-2D shown in FIG. 2B.

The heat exchanging body 200 has an interior configured to fluidly connect the inlet port 206 and the outlet port 208 (described further below). The heat exchanging body 200 may be cylindrical, as shown in FIG. 2A, or any other suitable shape. The heat exchanging body 200 may have a diameter between 150 and 200 mm, although other diameters are also possible. The first end 202 includes a first mounting flange 210 and the second end 204 includes a second mounting flange 222. The first mounting flange 210 and the second mounting flange 222 are coupled to the heat exchanging body 200 via connection surfaces, the connection surfaces being parallel to a central axis 224. The heat exchanging body 200 extends from the first mounting flange 210 to the second mounting flange 222 such that the second mounting flange 222 is disposed a distance from the first mounting flange 210. This distance can be between 200 and 250 mm, while other distances are also possible. The heat exchanging body 200 comprises an outer wall 216 configured to enclose an internal region 218 of the heat exchanger 106, and each of the outer wall 216 and internal region 218 extend from the first mounting flange 210 to the second mounting flange 222. For reference, a plane 226 (e.g., X-Y plane) is defined as being oriented substantially perpendicular to the central axis 224.

The internal region 218 includes a heat exchanging region 213 and an outer region 220 that are separated by an inner wall 214. The inner wall 214 defines a plurality of fin structures 233. In one example, as shown in FIG. 2B, the plurality of fin structures 233 include six fin structures. In general, the fin structures 233 each have a shape that extends radially and in an axial direction, and also has a curved heat exchanging surface that varies in at least two non-parallel directions, which for a radially symmetric design includes the axial direction (Z-direction), radial direction, and/or theta direction.

The inner wall 214 is positioned within the heat exchanging body 200 to fluidly isolate the heat exchanging region 213 from the outer region 220 of the internal region 218. The outer region 220 is defined by a space formed between the inner wall 214 and the outer wall 216. The heat exchanging region 213 can be designed to collect the effluent exiting the plasma source 104 (as shown in FIG. 1). As described above, the effluent will recombine after exiting the plasma source 104, the recombination occurring in the heat exchanging region 213. This recombination reaction releases a great amount of energy, causing the temperature of the already hot effluent to increase. Therefore, the heat exchanging region 213 is configured to operate at the temperature of the hot effluent, and can range from 400 to 800 degrees Celsius. A coolant may be flowed (e.g., coolant P in FIG. 2E) through the outer region 220 and against a heat exchanging surface 212 of the inner wall 214. The coolant can be flowed via a tube or passage via a water inlet 228. The water inlet 228 is located toward the bottom of the heat exchanging body 200 and a water outlet 230 is located toward the top of the heat exchanging body 200. As such, the coolant is made to flow from the bottom to the top of the heat exchanging body 200 and is drained from the top of the heat exchanger 106. The opening area of the water inlet 228 can be the same as the area of the inlet port 206, minimizing the pressure drop from the inlet port 206 to the outlet port 208. The heat exchanging surface 212 is adjacent to the heat exchanging region 213, and acts to cool the effluent downstream passing through the fin structures 233 contacting the heat exchanging region 213, preventing heat damage to the process vacuum pump 108 disposed downstream of the heat exchanger 106.

Figure 2E:
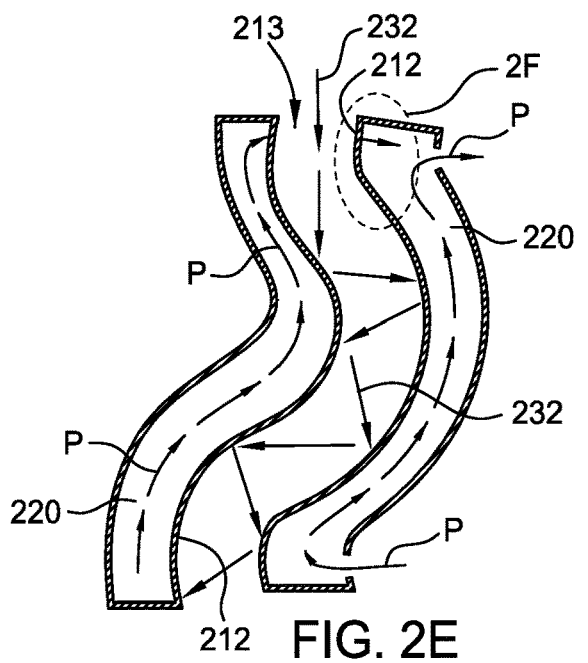
FIG. 2E is a schematic cross-sectional view of at least one embodiment of the heat exchanging surface of FIGS. 2A-2D.

FIG. 2E shows a schematic cross-sectional view of one embodiment of the heat exchanging surface 212 of the heat exchanging region 213 of FIGS. 2A-2D. The heat exchanging region 213 is disposed between two fin structures 233. Reference arrows 232 show the flow path of the hot effluent through the heat exchanging region 213, which impinges and contacts the heat exchanging surface 212. The heat exchanging surface 212 can be a curved surface, in which the curvature varies in a direction parallel to the central axis 224 as shown in FIGS. 2C-2D. A tangent of the curvature at any point on the heat exchanging surface 212 has an angle, A, relative to the central axis 224 that can be less than or equal to 45 degrees, which again is best shown in FIGS. 2C-2D. However, an angle of 45 degrees is not intended to be limiting as to the scope of the disclosure provided herein, since the angle A relative to the central axis 224 can vary depending on the method of manufacturing and material used to form the heat exchanger 106. It has been found that configuring the curvature of the interior walls of the heat exchanger 106 so that their curvature at any point relative to a vertical central axis is less than or equal to 45 degree will improve the manufacturability of the heat exchanger by an additive manufacturing process using stainless steel and also improve the heat transfer characteristics of the formed heat exchanging device.

Figure 2F:
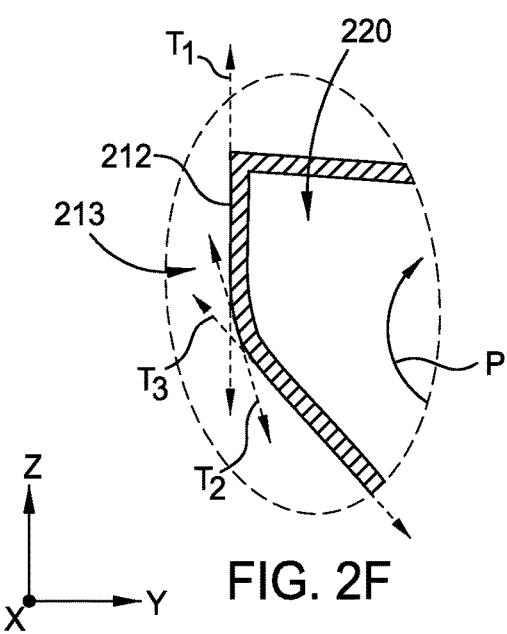
FIG. 2F is a close-up schematic cross-sectional view of a portion of the heat exchanging surface illustrated in FIG. 2E.

In one example, as shown in FIG. 2F, tangents T1, T2 and T3 of the heat exchanging surface 212 always have an angle relative to the central axis (i.e., parallel to the Z axis) that is less than 45 degrees when using a stainless steel material, such as 316 stainless steel. In other embodiments, when a stainless steel material is not used, the angle, A, can be less than or equal to 60 degrees or 70 degrees in relation to the central axis 224 depending on manufacturing method and material. The reference arrows 232 show a multi stage cross flow path that increases the residence time of the hot effluent as it hits the cold walls of the heat exchanging surfaces 212 of the fin structures 233, thereby increasing cooling efficiency. In addition, by forming the fin structures 233 so that they have a varying surface curvature, this configuration can be used to ensure that no part of the hot effluent will miss the heat exchanging surface 212 of the inner wall 214, to cool the hot effluent to prevent the hot effluent from damaging the process vacuum pump 108 and/or other structures downstream. The temperature of the walls of the heat exchanging surface 212 can range from 20 to 50 degrees Celsius, cooling the hot effluent to be within that temperature range by the time it exits into the process vacuum pump 108.

Figure 3A:
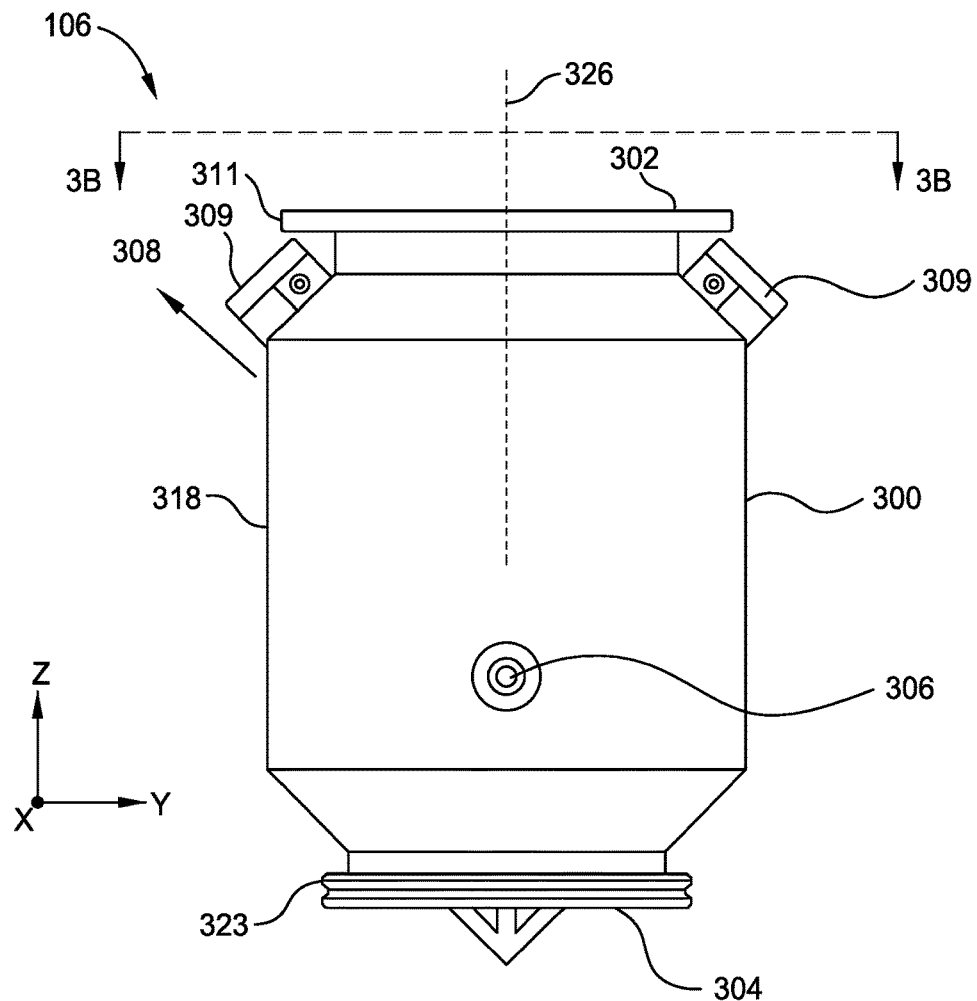
FIG. 3A is a schematic side view of at least one embodiment of the heat exchanger of FIG. 1.
Figure 3B:
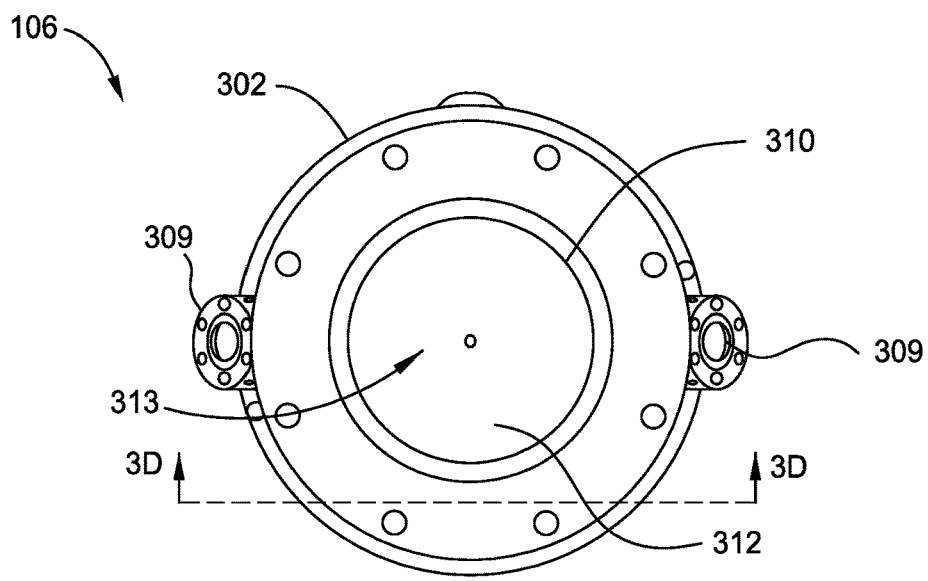
FIG. 3B is a top section view of at least one embodiment of the heat exchanger of FIG. 1 that is sectioned along a horizontal plane (X-Y plane) coincident with line 3B-3B shown in FIG. 3A.
Figure 3C:
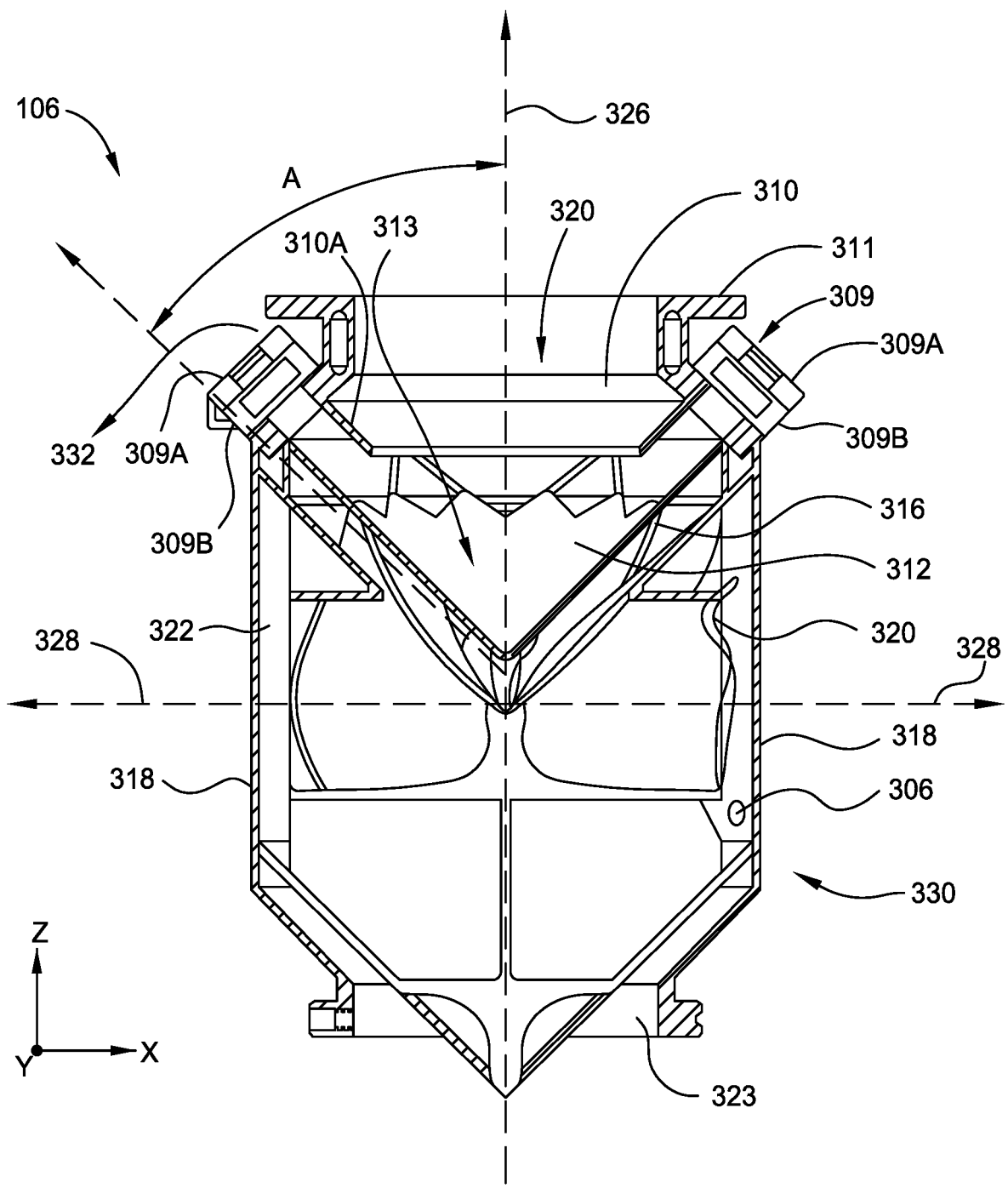
FIG. 3C is a schematic cross-sectional view of at least one embodiment of the heat exchanger of FIG. 1.
Figure 3D:
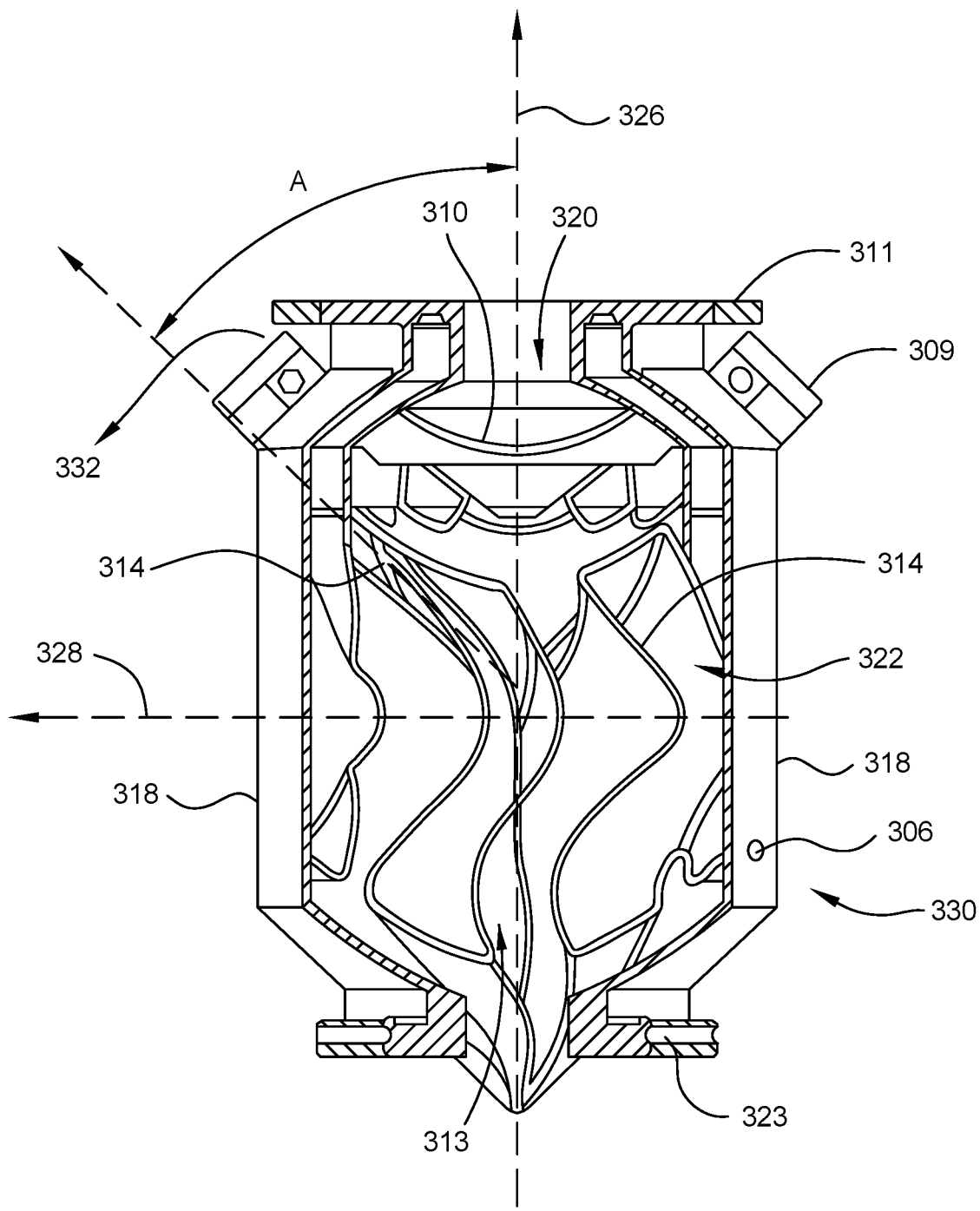
FIG. 3D is another schematic cross-sectional view of at least one embodiment of the heat exchanger of FIG. 1 that is sectioned along a vertical plane (Y-Z plane) coincident with line 3D-3D shown in FIG. 3B.

FIGS. 3A-3D show schematic, top, and cross-sectional views of at least one embodiment of the heat exchanger 106 of FIG. 1. As shown in FIG. 3A, the heat exchanger 106 includes a heat exchanging body 300, a first end 302, a second end 304 opposite the first end 302, an inlet port 306, and an outlet port 308 opposite the inlet port 306. FIG. 3B is a top section view of the heat exchanger 106, which was sectioned along a horizontal plane (X-Y plane) coincident with line 3B-3B shown in FIG. 3A. FIG. 3C is a schematic cross-sectional view of the heat exchanger 106 of FIG. 1. FIG. 3D is schematic cross-sectional view of the heat exchanger 106 of FIG. 1, which was sectioned by a vertical plane (Y-Z plane) coincident with line 3D-3D shown in FIG. 3B.

In this embodiment, much like the embodiment shown in FIGS. 2A-2D, the heat exchanging body 300 has an interior configured to fluidly connect the inlet port 306 and the outlet port 308 (described further below). The heat exchanging body 300 may be cylindrical, as shown in FIG. 3A, or any other suitable shape. The heat exchanging body 300 can have a diameter between 150 and 200 mm, although other diameters are also possible. The first end 302 includes a first mounting flange 311 and the second end 304 includes a second mounting flange 323. The first mounting flange 311 and the second mounting flange 323 are coupled to the heat exchanging body 300 via connection surfaces, the connection surfaces being parallel to a central axis 326. The heat exchanging body extends from the first mounting flange 311 to the second mounting flange 323 such that the second mounting flange 323 is disposed a distance from the first mounting flange 311. This distance can be between 200 and 250 mm, however other distances are also possible. The heat exchanging body 300 comprises an outer wall 318 configured to enclose an internal region 320 of the heat exchanger 106, and each of the outer wall 318 and internal region 320 extend from the first mounting flange 311 to the second mounting flange 323. For reference, a plane 328 is defined as being oriented substantially perpendicular to the central axis 326. The internal region 320 includes a heat exchanging region 313 and an outer region 322 that are separated by an inner wall 316. An inner wall 316 is positioned within the heat exchanging body 300 to fluidly isolate the heat exchanging region 313 from the outer region 322 of the internal region 320. The outer region 322 is defined by a space formed between the inner wall 316 and the outer wall 318.

Additionally, the heat exchanger 106 comprises at least one view port (two shown) 309, a deflector 310, and a cone tray 312. The view ports 309 include a clamp 309A that is used to seal a window 309B against a portion of the outer wall 318. This can allow a user positioned outside the heat exchanger 106 to look inside the heat exchanging body 300 to view particles collected in the cone tray 312. The cone tray 312 is enclosed within the inner wall 316 and is designed to trap and isolate the maximum number of particles entering the heat exchanger 106 during a processing chamber 101 processing sequence. Further, the deflector 310 is designed to deflect some of the clean gas so that the gas will interact with and react with the solid deposits, improving cleaning efficiency. The deflector 310 can be designed with an integrated lip 310A (FIG. 3C) to allow the particles to fall on the cone tray 312.

The outer region 322 is defined by a space formed between the inner wall 316 and the outer wall 318. Similar to the embodiment described in FIGS. 2A-2D, the effluent will recombine after exiting the plasma source 104. The recombination will typically occur in the heat exchanging region 313. This recombination reaction releases a significant amount of energy, causing the temperature of the already hot effluent to increase. Therefore, the heat exchanging region 313 takes on the temperature of the hot effluent, and can range from 400 to 800 degrees Celsius. A coolant may be flowed (e.g., coolant P in FIG. 3E) through the outer region 322 and against heat exchanging surface 314. The coolant can be flowed via a tube or passage via a water inlet 330. The water inlet 330 is located toward the bottom of the heat exchanging body 300 and a water outlet 332 is located toward the top of the heat exchanging body 300. As such, the coolant is made to flow from the bottom to the top of the heat exchanging body 300 and is drained from the top of the heat exchanger 106. The opening area of the water inlet 330 can be the same as the area of the inlet port 306, minimizing the pressure drop from the inlet port 306 to the outlet port 308. The heat exchanging surface 314 is adjacent to the heat exchanging region 313, and acts to cool the effluent downstream from the heat exchanging region 313, preventing heat damage to the process vacuum pump 108.

Figure 3E:
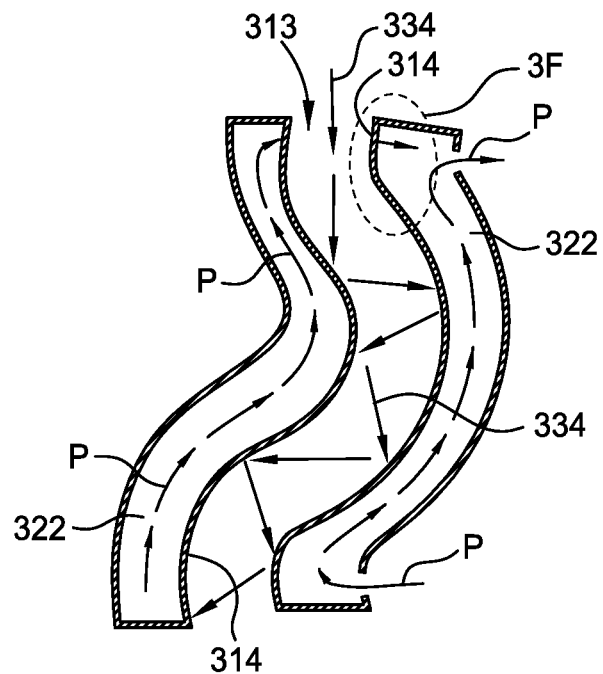
FIG. 3E is a schematic cross-sectional view of at least one embodiment of the heat exchanging surface of FIGS. 3A-3D.
Figure 3F:
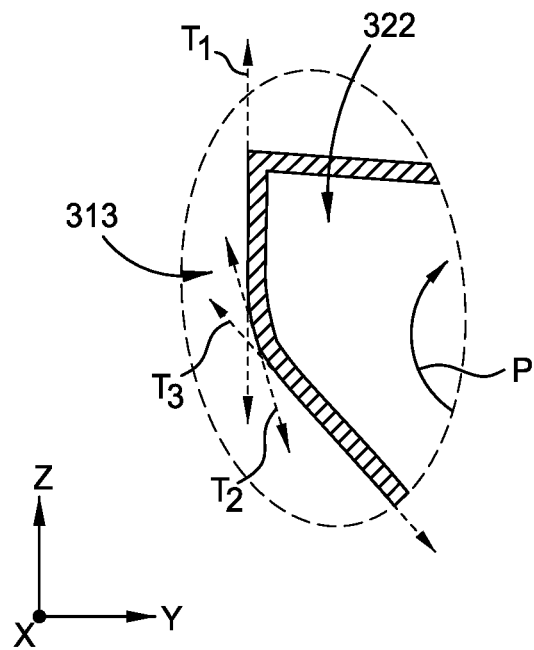
FIG. 3F is a close-up schematic cross-sectional view of a portion of the heat exchanging surface illustrated in FIG. 3E.

Similar to the embodiment shown in FIG. 2E, FIG. 3E shows a schematic cross-sectional view of one embodiment of the heat exchanging surface 314 of the heat exchanging region 313 of FIGS. 3A-3D. The heat exchanging region 313 is disposed between two fin structures 333, similar to the embodiment described in FIG. 2E above. Reference arrows 334 show the flow path of the hot effluent through the heat exchanging region 313, which impinges and contacts the heat exchanging surface 314. The heat exchanging surface 314 can be a curved surface, in which the curvature varies in a direction parallel to the central axis 326 as shown in FIGS. 3C-3D. A tangent of the curvature at any point on the heat exchanging surface 314 has an angle, A, relative to the central axis 326 that can be less than or equal to 45 degrees, which again is best shown in FIGS. 3C-3D. In one example, as shown in FIG. 3F, tangents T1, T2 and T3 of the heat exchanging surface 314 always have an angle relative to the central axis (i.e., parallel to the Z axis) that is less than 45 degrees using a stainless steel material. In other embodiments, when stainless steel is not used, the angle, A, can be less than or equal to 60 degrees or 70 degrees relative to the central axis 326 depending on the method of manufacturing and material used. The reference arrows 334 show a multi stage cross flow path that increases the residence time of the hot effluent as it hits the cold walls of the heat exchanging surfaces 314, thereby increasing cooling efficiency. In addition, by forming the heat exchanging surfaces 314 so that they have a varying surface curvature, this configuration can be used to ensure that no part of the hot effluent will miss the heat exchanging surface 314 of the inner wall 316, to cool the hot effluent to prevent the hot effluent from damaging the process vacuum pump 108 and/or other structures downstream. The temperature of the walls of the heat exchanging surface 314 can range from 20 to 50 degrees Celsius, cooling the hot effluent to be within that temperature range by the time it exits into the process vacuum pump 108. The temperature on the cone tray 312 will be slightly less than the temperature of the gas to enable deposition of the solid and liquid effluent.

Figure 4:
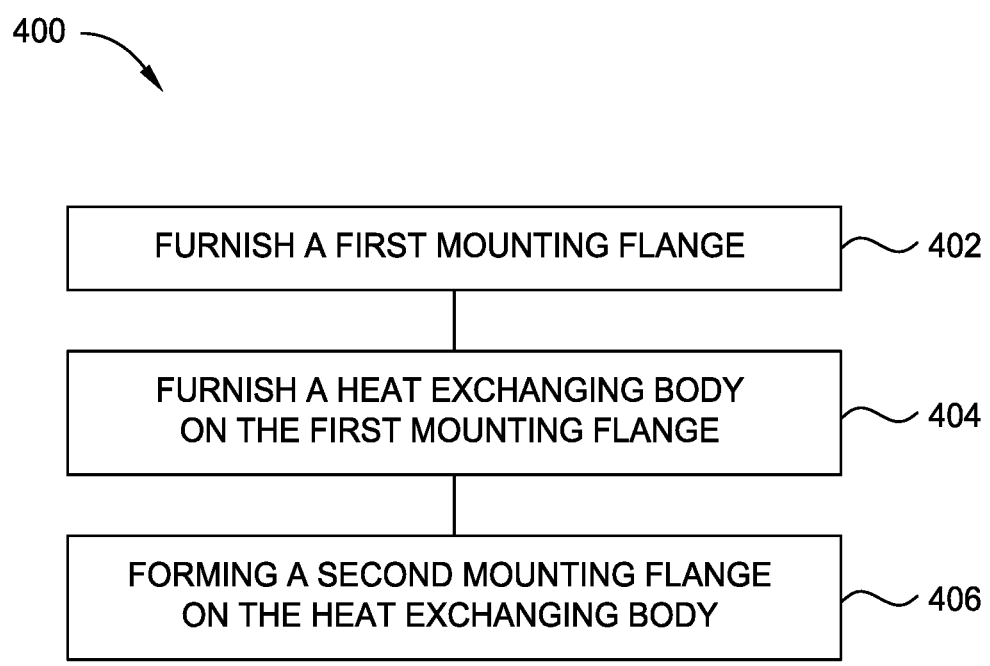
FIG. 4 is a flow chart of a method for forming the heat exchanger according to at least one embodiment described herein.

FIG. 4 shows a flow chart of a method 400 for forming the heat exchanger according to at least one embodiment described herein. The method 400 of forming a heat exchanger that is configured to exchange heat with a flowing fluid. The layers can be deposited by using an additive manufacturing process, such as 3D printing process and the like. This provides the advantage of allowing the recombination and staged cooling in much higher efficiency in a much smaller foot print, reducing costs. The stages can be extended depending on the cooling required.

More specifically, in some embodiments, the construction of a heat exchanger begins by creating a CAD model of the three dimensional version of the heat exchanger. This can be done through the use of existing CAD design software, such as Unigraphics or other similar software. An output file, which is generated by the modelling software, is then loaded to an analysis program to ensure that the heat exchanger design meets the design requirements (e.g., gas tight, angular orientation of the curvature of the heat exchanging surface, mass density). The output file is then rendered, and the 3D model is then "sliced" into a series of 2D data bitmaps, or pixel charts. The 2D bitmaps, or pixel charts, are used to define the locations across an X and Y plane where the layers in the heat exchanger will be built. In this configuration, the additive manufacturing process will use these locations to define where a laser will be applied to form the desired layer features.

The coordinates found in the pixel charts are used to define the location at which laser energy will be focused. Every coordinate for an X and Y location and a given heat exchanger supporting Z stage position will be defined based on the pixel charts. Each X, Y and Z location will include either a laser energy delivery or non-delivery condition. By combining the pixel charts in each formed layer, a heat exchanger of a desirable shape and structural configuration can be printed by the positioning of the laser energy in a desirable pattern across the layer. This process can be used to perform each of the blocks described below.

In block 402, a first mounting flange is formed having a central opening. The first mounting flange can sequentially deposit layers of a material on a first surface.

In block 404, a heat exchanging body is formed on the first mounting flange. The heat exchanging body has a heat exchanging section that encloses a heat exchanging region that extends in a direction that is perpendicular to the first surface. The heat exchanging body can sequentially deposit layers of the thermally conductive material on a surface of the formed first mounting flange. In some embodiments, the conductive material includes a metal (e.g., Ti, Ni, Fe), a metal alloy (e.g., SST), a thermally conductive ceramic material (e.g., AlN, AlOx, BN), or other thermally conductive material that is inert to the effluent materials. The sequentially deposited layers disposed within the heat exchanging section can each include at least a portion of an outer wall and at least a portion of an inner wall. The outer wall can be configured to enclose an internal region of the heat exchanging body, and the internal region has a central axis that is substantially perpendicular to the first surface. The inner wall can be disposed within the internal region, and is positioned to isolate the heat exchanging region from an outer region of the internal region. The outer region can be defined by a space formed between the inner wall and the outer wall. The inner wall can have a heat exchanging surface that is adjacent to the heat exchanging region. The heat exchanging surface can have a curvature that varies in a direction parallel to the central axis, and a tangent of the curvature at any point on the heat exchanging surface has an angle relative to central axis that is less than or equal to 70 degrees, 60 degrees, 45 degrees, 30 degrees, or 20 degrees. However, other angles are also possible.

In block 406, a second mounting flange is formed on the heat exchanging body. The second mounting flange can sequentially deposit layers of a material on the heat exchanging body. The heat exchanging body can have a diameter between 150 and 200 mm, however the diameter can be other lengths. The distance between the first mounting flange and the second mounting flange can be between 200 and 250 mm, although other distances are possible.

While the foregoing is directed to embodiments of the present disclosure, other and further embodiments of the disclosure may be devised without departing from the basic scope thereof, and the scope thereof is determined by the claims that follow.

We claim:

1. A heat exchanger configured to exchange heat with a flowing fluid, comprising:
   a first mounting flange having a central opening that extends through a connection surface of the first mounting flange, wherein the connection surface is parallel to a first plane;
   a second mounting flange having a central opening that extends through a connection surface of the second mounting flange, wherein the second mounting flange is disposed a distance in a first direction from the first mounting flange;
   an outer wall that is configured to enclose an internal region of the heat exchanger, wherein the outer wall and internal region are disposed between the first mounting flange and the second mounting flange;
   an inner wall that is disposed within the internal region, wherein the inner wall is positioned to isolate a heat exchanging region of the internal region from an outer region of the internal region, the outer region defined by a space formed between the inner wall and the outer wall;
   a heat exchanging fluid inlet port and a heat exchanging fluid outlet port, wherein the heat exchanging fluid inlet port and the heat exchanging outlet port are each in fluid communication with the outer region; and
   a cone tray with a closed end that is disposed within the inner wall, wherein the closed end of the cone tray is configured to collect particles passing through the central opening of the first mounting flange and trap and isolate the particles entering the heat exchanger.

2. The heat exchanger of claim 1, wherein the heat exchanging fluid inlet port has an opening that is in fluid communication with the outer region, and is disposed at a position closer to the first mounting flange than the second mounting flange.

3. The heat exchanger of claim 1, wherein the heat exchanging fluid outlet port has an opening that is in fluid communication with the outer region, and is disposed at a position closer to the first mounting flange than the second mounting flange.

4. The heat exchanger of claim 1, wherein an area of the opening of the heat exchanging fluid inlet port is substantially equal to an area of a water inlet.

5. The heat exchanger of claim 1, further comprising a view port having an opening that extends through the outer wall, wherein the opening is oriented to allow a user positioned outside of the outer wall to see at least a portion of the cone tray therethrough.

6. The heat exchanger of claim 1, further comprising a deflector configured to deflect gases passing through the central opening.

7. The heat exchanger of claim 6, wherein the deflector comprises an integrated lip.

8. A heat exchanger configured to exchange heat with a flowing fluid, comprising:
   a first mounting flange having a connection surface that is parallel to a first plane and a central opening that extends through the connection surface;

a second mounting flange having a connection surface, wherein the second mounting flange is disposed a distance in a first direction from the first mounting flange; and a heat exchanging body disposed between and coupled to the first mounting flange and the second mounting flange, wherein the heat exchanging body comprises:

an outer wall that is configured to enclose an internal region of the heat exchanging body, wherein the internal region has a central axis that is substantially perpendicular to the first plane;

an inner wall that is disposed within the internal region, wherein the inner wall is positioned to isolate a heat exchanging region of the internal region from an outer region of the internal region;

a cone tray with a closed end that is disposed within the inner wall, wherein the closed end of the cone tray is configured to collect particles passing through the central opening of the first mounting flange and trap and isolate the particles entering the heat exchanger, and, wherein the inner wall has a heat exchanging surface that is adjacent to the heat exchanging region, at least a portion of the heat exchanging surface has a curvature that varies in a direction parallel to the central axis, and a tangent of the curvature at any point on the heat exchanging surface has an angle relative to a central axis that is less than or equal to 60 degrees.

9. The heat exchanger of claim 8, further comprising a heat exchanging fluid inlet port that has an opening that is in fluid communication with the outer region, and is disposed at a position closer to the second mounting flange than the first mounting flange.

10. The heat exchanger of claim 9, further comprising a heat exchanging fluid outlet port that has an opening that is in fluid communication with the outer region, and is disposed at a position closer to the first mounting flange than the second mounting flange.

11. The heat exchanger of claim 8, wherein the heat exchanging body has a diameter between 150 and 200 mm.

12. The heat exchanger of claim 11, wherein a distance between the first mounting flange and the second mounting flange is between 200 and 250 mm.

13. The heat exchanger of claim 8, wherein the tangent of the curvature at any point on the heat exchanging surface has an angle relative to the central axis that is less than or equal to 45 degrees.

14. The heat exchanger of claim 8, wherein the tangent of the curvature at any point on the heat exchanging surface has an angle relative to the central axis that is less than or equal to 30 degrees.

15. A method of forming a heat exchanger that is configured to exchange heat with a flowing fluid, comprising:

forming a first mounting flange having a central opening, wherein forming the first mounting flange comprises sequentially depositing layers of a thermally conductive material on a first surface;

forming a heat exchanging body on the first mounting flange, wherein the heat exchanging body has a heat exchanging section that encloses a heat exchanging region that extends in a direction that is perpendicular to the first surface, and forming the heat exchanging body comprises sequentially depositing layers of the thermally conductive material on a surface of the formed first mounting flange, the sequentially deposited layers disposed within the heat exchanging section each include at least a portion of an outer wall and at least a portion of an inner wall, the outer wall is configured to enclose an internal region of the heat exchanging body, and the internal region has a central axis that is substantially perpendicular to the first surface, the inner wall is disposed within the internal region, and is positioned to isolate the heat exchanging region from an outer region of the internal region, wherein the outer region is defined by a space formed between the inner wall and the outer wall, the inner wall having a heat exchanging surface that is adjacent to the heat exchanging region, and the heat exchanging surface having a curvature that varies in a direction parallel to the central axis, and a tangent of the curvature at any point on the heat exchanging surface has an angle relative to central axis that is less than or equal to 60 degrees;

forming a cone tray with a closed end that is disposed within the inner wall, the closed end of the cone tray configured to collect particles passing through the central opening of the first mounting flange and to trap and isolate the particles entering the heat exchanger; and forming a second mounting flange on the heat exchanging body, wherein the second mounting flange comprises sequentially depositing layers of a thermally conductive material on the heat exchanging body.

16. The method of claim 15, wherein the heat exchanging body has a diameter between 150 and 200 mm.

17. The method of claim 15, wherein a distance between the first mounting flange and the second mounting flange is between 200 and 250 mm.

18. The method of claim 17, further comprising a heat exchanging fluid inlet port located toward the second mounting flange and a heat exchanging fluid outlet port located toward the first mounting flange.

19. The method of claim 18, wherein an opening area of the heat exchanging fluid inlet port is substantially equal to an area of a water inlet.

20. The method of claim 15, wherein the heat exchanger is formed by a 3D printing process using a stainless steel material.

* * * * *